US012592282B2

(12) United States Patent
Choi et al.

(10) Patent No.: US 12,592,282 B2
(45) Date of Patent: Mar. 31, 2026

(54) MEMORY DEVICE PERFORMING PROGRAM OPERATION AND METHOD OF OPERATING THE SAME

(71) Applicant: SK hynix Inc., Gyeonggi-do (KR)

(72) Inventors: Hyung Jin Choi, Gyeonggi-do (KR);
In Gon Yang, Gyeonggi-do (KR);
Young Seung Yoo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 217 days.

(21) Appl. No.: 18/357,162

(22) Filed: Jul. 24, 2023

(65) Prior Publication Data

US 2024/0274205 A1    Aug. 15, 2024

(30) Foreign Application Priority Data

Feb. 9, 2023    (KR) ........................ 10-2023-0017212

(51) Int. Cl.
*G11C 16/10*      (2006.01)
*G11C 16/04*      (2006.01)
*G11C 16/08*      (2006.01)
*G11C 16/34*      (2006.01)

(52) U.S. Cl.
CPC ........ *G11C 16/102* (2013.01); *G11C 16/0433*
(2013.01); *G11C 16/08* (2013.01); ***G11C
16/3459*** (2013.01)

(58) Field of Classification Search
CPC ... G11C 16/102; G11C 16/0433; G11C 16/08;
G11C 16/3459; G11C 11/5628; G11C
16/0483; G11C 16/10; G11C 7/12; G11C
7/18; G11C 16/26
See application file for complete search history.

(56) References Cited

U.S. PATENT DOCUMENTS

| | | | | |
|---|---|---|---|---|
| 11,189,326 B1 * | 11/2021 | Guo | ...................... | G11C 7/1057 |
| 11,551,762 B2 * | 1/2023 | Hwang | ................ | G11C 16/102 |
| 11,562,791 B1 * | 1/2023 | Nguyen | ................ | G11C 16/24 |
| 11,670,366 B2 * | 6/2023 | Guo | ...................... | G11C 16/26 |
| | | | | 365/185.03 |
| 2021/0391026 A1 * | 12/2021 | Choi | ...................... | G11C 16/08 |

FOREIGN PATENT DOCUMENTS

| | | |
|---|---|---|
| KR | 10-1572830 B1 | 11/2015 |
| KR | 10-2234592 B1 | 4/2021 |

* cited by examiner

*Primary Examiner* — Han Yang
*Assistant Examiner* — Christopher Lane Reece
(74) *Attorney, Agent, or Firm* — IP & T GROUP LLP

(57) ABSTRACT

The present technology relates to a semiconductor device. According to the present technology, a memory device having a reduced size may include a plurality of memory cells connected to a selected word line, a plurality of page buffers configured to store at least one second logical page data except for first logical page data in a plurality of first program loops performed on the plurality of memory cells, and store the first logical page data after the plurality of first program loops are performed, and a control logic configured to control the plurality of first program loops based on the at least one second logical page data, determine first memory cells programmed to one program state based on the first logical page data, and control a plurality of second program loops performed on second memory cells.

14 Claims, 8 Drawing Sheets

DATA STORED IN LATCH IN PL1 TO PLi

| SENSING LATCH (220) | PRE-VERIFY LATCH (230) | FIRST DATA LATCH (240) | SECOND DATA LATCH (250) |
|---|---|---|---|
| BIT LINE SETTING DATA + SENSING DATA | PRE-VERIFY DATA | LSB + MAIN VERIFY DATA | CSB + MAIN VERIFY DATA |

DATA STORED IN LATCH AFTER PERFORMING PL1 TO PLi

| SENSING LATCH (220) | PRE-VERIFY LATCH (230) | FIRST DATA LATCH (240) | SECOND DATA LATCH (250) |
|---|---|---|---|
| BIT LINE SETTING DATA + SENSING DATA | PRE-VERIFY DATA | LSB + MSB | CSB + MSB |

DATA STORED IN LATCH IN PLi+1 TO PLn

| SENSING LATCH (220) | PRE-VERIFY LATCH (230) | FIRST DATA LATCH (240) | SECOND DATA LATCH (250) |
|---|---|---|---|
| BIT LINE SETTING DATA + SENSING DATA | PRE-VERIFY DATA | LSB + MSB + MAIN VERIFY DATA | CSB + MSB + MAIN VERIFY DATA |

|  | E | P1 | P2 | P3 | P4 | P5 | P6 | P7 |
|---|---|---|---|---|---|---|---|---|
| MSB | 1 | 1 | 1 | 1 | 0 | 0 | 0 | 0 |
| CSB | 1 | 0 | 0 | 1 | 1 | 0 | 0 | 1 |
| LSB | 1 | 1 | 0 | 0 | 0 | 0 | 1 | 1 |

FIG. 5

DATA STORED IN LATCH IN PL1 TO PLi

| SENSING LATCH (220) | PRE-VERIFY LATCH (230) | FIRST DATA LATCH (240) | SECOND DATA LATCH (250) |
|---|---|---|---|
| BIT LINE SETTING DATA + SENSING DATA | PRE-VERIFY DATA | LSB + MAIN VERIFY DATA | CSB + MAIN VERIFY DATA |

DATA STORED IN LATCH AFTER PERFORMING PL1 TO PLi

| SENSING LATCH (220) | PRE-VERIFY LATCH (230) | FIRST DATA LATCH (240) | SECOND DATA LATCH (250) |
|---|---|---|---|
| BIT LINE SETTING DATA + SENSING DATA | PRE-VERIFY DATA | LSB + MSB | CSB + MSB |

DATA STORED IN LATCH IN PLi+1 TO PLn

| SENSING LATCH (220) | PRE-VERIFY LATCH (230) | FIRST DATA LATCH (240) | SECOND DATA LATCH (250) |
|---|---|---|---|
| BIT LINE SETTING DATA + SENSING DATA | PRE-VERIFY DATA | LSB + MSB + MAIN VERIFY DATA | CSB + MSB + MAIN VERIFY DATA |

FIG. 7

|  | E | P1 | P2 | P3 | P4 | P5 | P6 | P7 |
|---|---|---|---|---|---|---|---|---|
| MSB | 1 | 1 | 1 | 1 | 0 | 0 | 0 | 0 |
| CSB | 1 | 0 → 1 | 0 → 1 | 1 | 1 | 0 | 0 | 1 |
| LSB | 1 | 1 | 0 → 1 | 0 → 1 | 0 | 0 | 1 | 1 |

FIG. 8

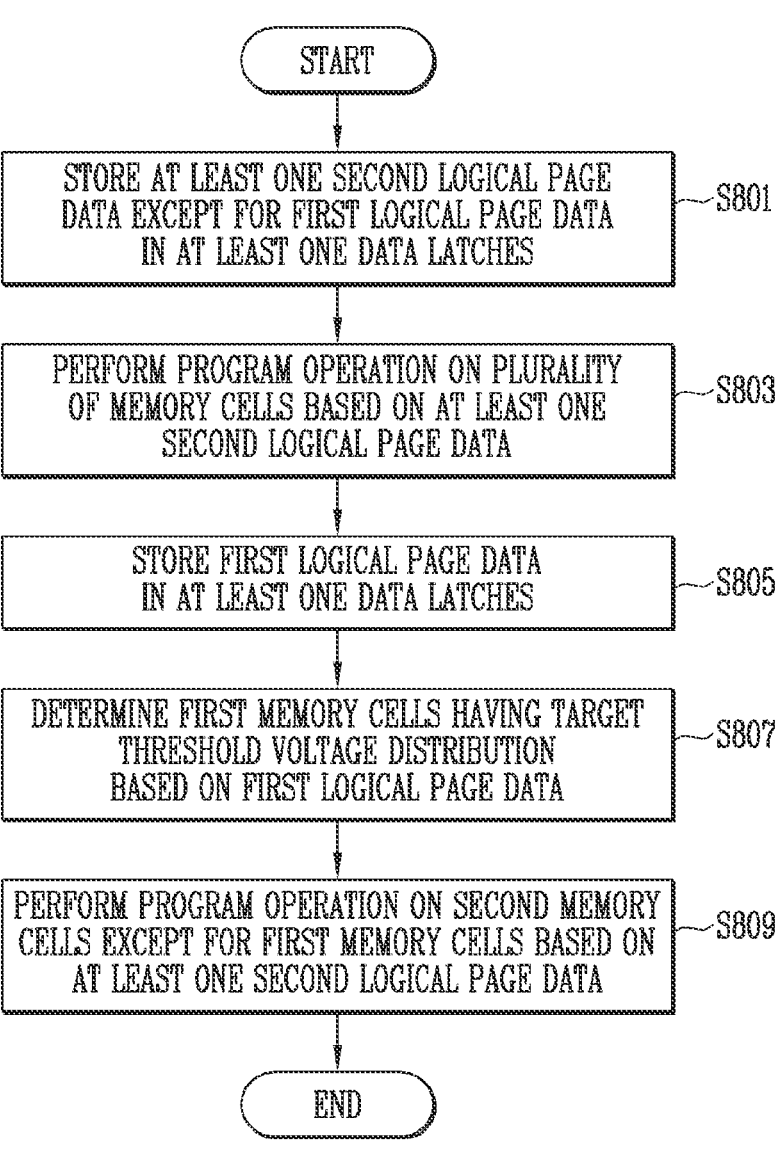

START

STORE AT LEAST ONE SECOND LOGICAL PAGE DATA EXCEPT FOR FIRST LOGICAL PAGE DATA IN AT LEAST ONE DATA LATCHES —S801

PERFORM PROGRAM OPERATION ON PLURALITY OF MEMORY CELLS BASED ON AT LEAST ONE SECOND LOGICAL PAGE DATA —S803

STORE FIRST LOGICAL PAGE DATA IN AT LEAST ONE DATA LATCHES —S805

DETERMINE FIRST MEMORY CELLS HAVING TARGET THRESHOLD VOLTAGE DISTRIBUTION BASED ON FIRST LOGICAL PAGE DATA —S807

PERFORM PROGRAM OPERATION ON SECOND MEMORY CELLS EXCEPT FOR FIRST MEMORY CELLS BASED ON AT LEAST ONE SECOND LOGICAL PAGE DATA —S809

END

MEMORY DEVICE PERFORMING PROGRAM OPERATION AND METHOD OF OPERATING THE SAME

CROSS-REFERENCE TO RELATED APPLICATION

The present application claims priority under 35 U.S.C. § 119(a) to Korean patent application number 10-2023-0017212 filed on Feb. 9, 2023, the entire disclosure of which is incorporated by reference herein.

BACKGROUND

1. Field of Invention

Embodiments of the present disclosure relate to a semiconductor device, and more particularly, to a program operation of a memory device.

2. Description of Related Art

A memory device is a device storing data, and may be classified into a volatile memory device and a nonvolatile memory device.

The memory device may include a page buffer. The page buffer may include a data latch that backs up data to be stored during a program operation. Recently, as a size of the page buffer decreases, the number of data latches also decreases.

SUMMARY

An embodiment of the present disclosure provides a memory device in which the number of data latches used during a program operation is reduced, and a method of operating the memory device.

According to an embodiment of the present disclosure, a memory device may include a plurality of memory cells connected to a selected word line among a plurality of word lines, each programmed to one program state among a plurality of program states, a plurality of page buffers configured to store at least one second logical page data in a plurality of first program loops performed on the plurality of memory cells, and store first logical page data after the plurality of first program loops are performed, the at least one second logical page data being logical page data except for the first logical page data among a plurality of logical page data to be stored in the plurality of memory cells, and a control logic configured to control the plurality of first program loops based on the at least one second logical page data, determine first memory cells based on the first logical page data, and control a plurality of second program loops performed on second memory cells, the first memory cells being memory cells programmed to the one program state among the plurality of memory cells, the second memory cells being memory cells except for the first memory cells among the plurality of memory cells.

According to an embodiment of the present disclosure, a method of operating a memory device may include storing, in at least one data latch, at least one second logical page data except for first logical page data among a plurality of logical page data, performing a program operation on a plurality of memory cells based on the at least one second logical page data, storing the first logical page data in the at least one data latch, determining first memory cells having a target threshold voltage among the plurality of memory cells based on the first logical page data, and performing a program operation on second memory cells except for the first memory cells among the plurality of memory cells based on the at least one second logical page data.

According to an embodiment of the present disclosure, a memory device may include a plurality of memory cells connected to a selected word line among a plurality of word lines, including a triple level cell (TLC) storing three bits of data, a plurality of page buffers configured to store least significant bit (LSB) data and central significant bit (CSB) data in a plurality of first program loops, and store most significant bit (MSB) data after the plurality of first program loops are performed, the LSB data and the CSB data being data to be stored in the plurality of memory cells, the plurality of first program loops being performed on the plurality of memory cells, and a control logic configured to control the plurality of first program loops based on the LSB data and the CSB data, determine first memory cells based on the MSB data, and control a plurality of second program loops performed on second memory cells based on the LSB data and the CSB data, the first memory cells having a target threshold voltage among the plurality of memory cells, the second memory cells being memory cells except for the first memory cells among the plurality of memory cells.

According to an embodiment of the present disclosure, a memory device may include a plurality of memory cells, a plurality of page buffers including a plurality of data latches and a control logic configured to control program operations such that logical page data items are programmed to the plurality of memory cells, the logical page data items including multiple data items and a remaining data item, wherein the number of the plurality of data latches is less than the number of the logical page data items, and wherein the control logic is configured to: perform a plurality of program loops for the multiple data items such that the multiple data items are stored in the plurality of data latches and then are stored in the plurality of memory cells, and the plurality of memory cells have a threshold voltage corresponding to one or more first program states, store the remaining data item in the plurality of data latches, determine a first memory cell among the plurality of memory cells, which has a target threshold voltage distribution and perform a program operation for the multiple data items on second memory cells excluding the first memory cell among the plurality of memory cells such that the second memory cells have second program states greater than the first program states.

According to the present technology, a memory device having a reduced size, and a method of operating the same are provided.

BRIEF DESCRIPTION OF THE DRAWINGS

FIG. 5 is a diagram illustrating data stored in a data latch according to an embodiment of the present disclosure.

FIG. 7 is a diagram illustrating an example of setting first memory cells as program inhibit cells according to an embodiment of the present disclosure.

FIG. 8 is a flowchart illustrating a method of operating a memory device according to an embodiment of the present disclosure.

DETAILED DESCRIPTION

Specific structural or functional descriptions of embodiments according to the concept of the present disclosure disclosed in the present specification are illustrated only to describe the embodiments according to the concept of the present disclosure. The embodiments according to the concept of the present disclosure may be carried out in various forms and are not limited to the embodiments described in the present specification.

Figure 1:
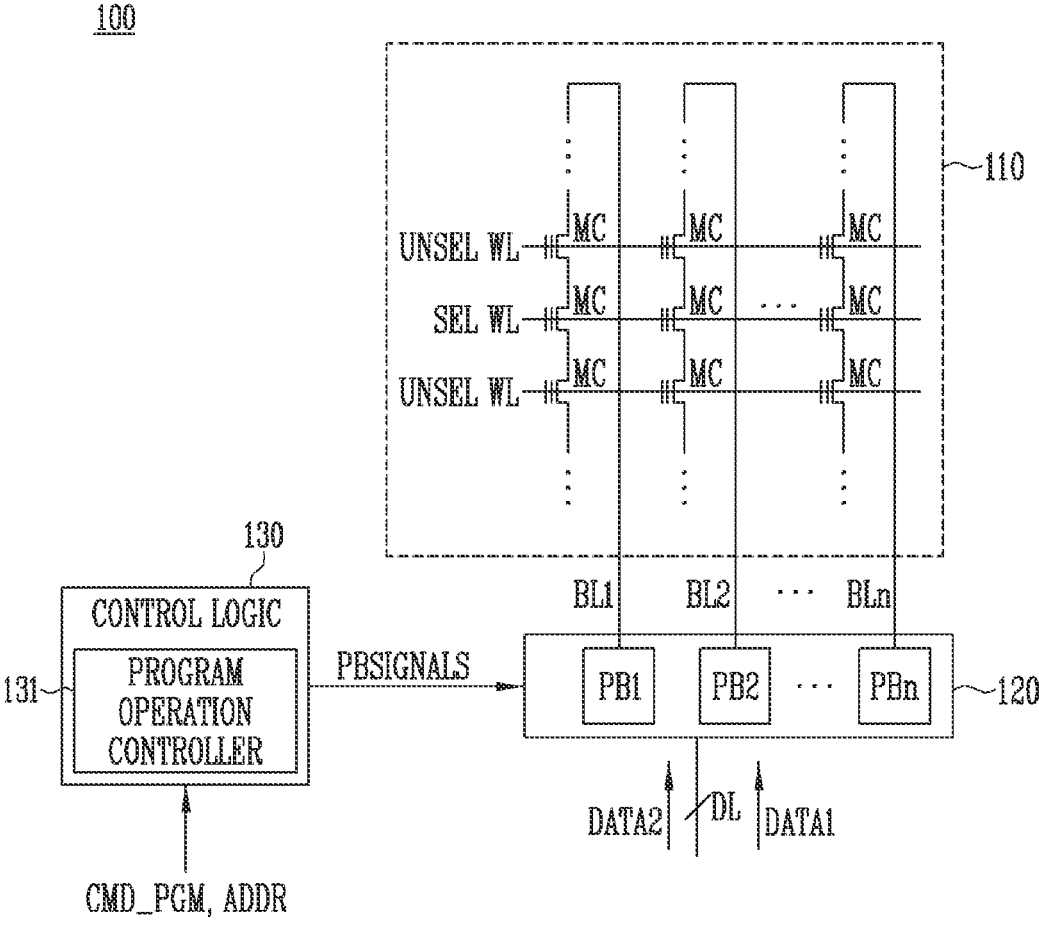
FIG. 1 is a diagram illustrating a memory device according to an embodiment of the present disclosure.

FIG. 1 is a diagram illustrating a memory device 100 according to an embodiment of the present disclosure.

Referring to FIG. 1, the memory device 100 may include a memory cell array 110, a page buffer group 120, and a control logic 130.

The memory cell array 110 may include a plurality of memory cells MC storing data. Each of the memory cells MC may be configured as a multi level cell (MLC) storing two bits of data, a triple level cell (TLC) storing three bits of data, or a quad level cell (QLC) storing four bits of data.

In the present specification, for convenience of description, it is assumed that the plurality of memory cells MC are configured as TLCs. However, this is only an example, and examples described below may be equally applied to memory cells of another configuration.

In an embodiment, each of the plurality of memory cells MC may be programmed to a program state among a plurality of program states through a program operation. The program operation may include a plurality of program loops. Each of the plurality of program loops may include a program voltage apply operation of applying a program voltage to a selected word line SEL WL and a verify operation of verifying a program state of the memory cells MC.

Each of the plurality of memory cells MC may be connected to one word line. In addition, each of the plurality of memory cells MC may be connected to the page buffer group 120 through a bit line among plurality of bit lines BL1 to BLn.

The page buffer group 120 may include a plurality of page buffers PB1 to PBn.

The plurality of page buffers PB1 to PBn may be connected to the memory cell array 110 through the plurality of bit lines BL1 to BLn, respectively.

During the program voltage apply operation, the plurality of page buffers PB1 to PBn may transfer data to be stored to the selected memory cells MC when a program voltage is applied to the selected word line SEL WL. The memory cells MC of the selected word line SEL WL may be programmed according to the transferred data. A memory cell MC connected to a bit line to which a program allowable voltage (for example, a ground voltage) is applied may have an increased threshold voltage. A threshold voltage of a memory cell MC connected to a bit line to which a program inhibit voltage (for example, a power voltage) is applied may be maintained. During the verify operation, the plurality of page buffers PB1 to PBn may read, from selected memory cells, data stored in the selected memory cells of the memory cells MC through the bit lines BL1 to BLn.

In an embodiment, the plurality of page buffers PB1 to PBn may receive a plurality of logical page data to be stored in the plurality of memory cells MC through data lines DL. In an embodiment, the plurality of logical page data may include first logical page data DATA1 and at least one second logical page data DATA2. The first logical page data DATA1 may mean most significant bit (MSB) data, and at least one second logical page data DATA2 may mean least significant bit (LSB) data and central significant bit (CSB) data.

In an embodiment, the plurality of page buffers PB1 to PBn may store at least one second logical page data DATA2 in a plurality of first program loops.

In an embodiment, the plurality of page buffers PB1 to PBn may store the first logical page data DATA1 after the plurality of first program loops are performed.

The control logic 130 may control an overall operation of the memory device 100. For example, the control logic 130 may control the plurality of page buffers PB1 to PBn by outputting page buffer control signals PBSIGNALS.

In an embodiment, the control logic 130 may include a program operation controller 131.

The program operation controller 131 may control the program operation on the plurality of memory cells MC connected to the selected word line SEL WL in response to a program command CMD_PGM and an address ADDR received from a memory controller (not shown).

For example, during the program voltage apply operation, the program operation controller 131 may apply a program voltage to the selected word line SEL WL and apply a program pass voltage of a level less than that of the program voltage to unselected word lines UNSEL WL. During the verify operation, the program operation controller 131 may apply a verify voltage to the selected word line SEL WL and apply a verify pass voltage of a level greater than that of the verify voltage to the unselected word lines UNSEL WL.

In an embodiment, the program operation controller 131 may control the plurality of first program loops based on at least one second logical page data DATA2.

In an embodiment, the program operation controller 131 may determine first memory cells based on the first logical page data DATA1. In an embodiment, the first memory cells may include a memory cell programmed to a program state among the plurality of memory cells MC connected to the selected word line SEL WL. That is, the first memory cells may include a memory cell having each target threshold voltage.

In an embodiment, the program operation controller 131 may control a plurality of second program loops on second memory cells except for the first memory cells among the plurality of memory cells connected to the selected word line SEL WL. At this time, the plurality of second program loops may be performed after the plurality of first program loops.

Figures 2, 3:
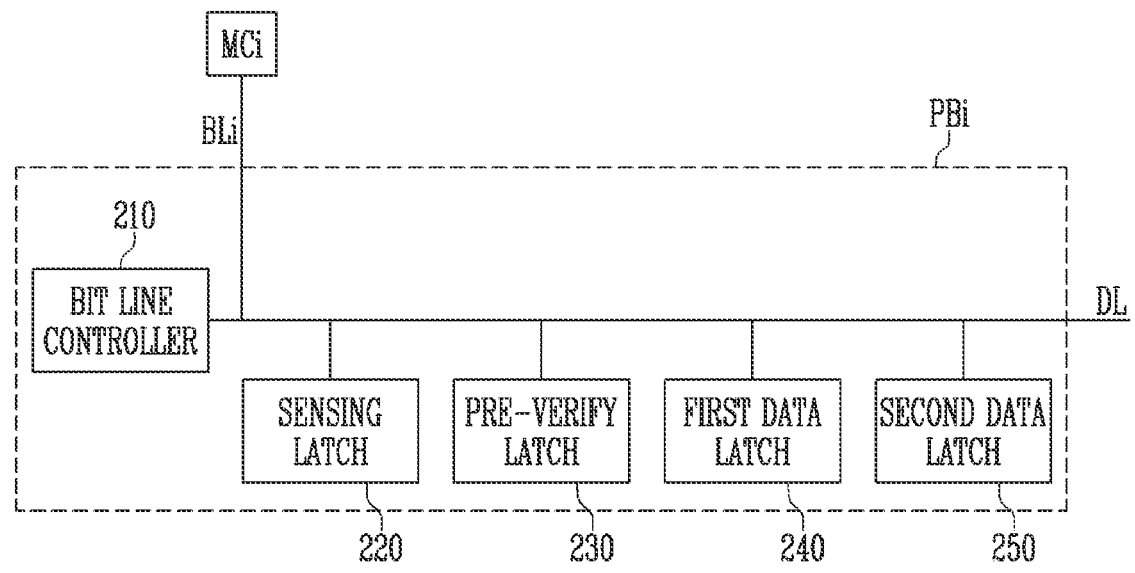
FIG. 2 is a diagram illustrating a page buffer according to an embodiment of the present disclosure.
FIG. 3 is a diagram illustrating a data bit corresponding to a state of a memory cell according to an embodiment of the present disclosure.

FIG. 2 is a diagram illustrating a page buffer PBi according to an embodiment of the present disclosure.

The page buffer PBi shown in FIG. 2 may be a page buffer PBi among the plurality of page buffers PB1 to PBn shown in FIG. 1.

Referring to FIG. 2, the page buffer PBi may be connected, through a selected bit line BLi, to a memory cell MCi among the plurality of memory cells connected to the selected word line.

In an embodiment, the page buffer PBi may include a bit line controller 210, a sensing latch 220, a pre-verify latch 230, a first data latch 240, and a second data latch 250.

The bit line controller 210 may control a voltage of the bit line BLi based on bit line setting data stored in the sensing latch 220.

In an embodiment, the bit line controller 210 may precharge the bit line BLi with one of the program allowable voltage or the program inhibit voltage. When the memory cell MCi is being programmed, the bit line controller 210 may apply the program allowable voltage to the bit line BLi. When program of the memory cell MCi is completed, the bit line controller 210 may apply the program inhibit voltage to the bit line BLi.

The sensing latch 220 may store data sensed from the bit line BLi. The sensed data may be used in the verify operation as a sensing voltage or a sensing current.

In an embodiment, the verify operation using the page buffer PBi may be performed using a main verify voltage and a pre-verify voltage having a potential level less than that of the main verify voltage. Verify data generated by such a verify operation may include main verify data for the main verify voltage and pre-verify data for the pre-verify voltage. For example, the verify data may indicate result data obtained by comparing a threshold voltage of the memory cell MCi with the main verify voltage or the pre-verify voltage.

In addition, the sensing latch 220 may store the bit line setting data used for determining a voltage with which the bit line is precharged.

The pre-verify latch 230 may store the pre-verify data indicating whether to apply the pre-verify voltage to the selected word line.

In an embodiment, the page buffer PBi may include at least one of the data latches 240 and 250 storing the plurality of logical page data to be stored in the memory cell MCi.

In an embodiment, the at least one of the data latches 240 and 250 may be configured with a number less than that of the plurality of logical page data. Specifically, the page buffer PBi may be configured with two data latches (i.e., first data latch 240 and second data latch 250) less than that of three MSB data, LSB data, and CSB data.

In an embodiment, the at least one of the data latches 240 and 250 may be configured with the same number of second logical page data. Specifically, the page buffer PBi may include two data latches (i.e., first data latch 240 and second data latch 250) identical to the two data (i.e., LSB data and CSB data).

According to the logical page data stored in the first data latch 240 and the second data latch 250, the memory cell MCi connected to the bit line BLi may be programmed to have a threshold voltage corresponding to a program state among the plurality of states.

The first data latch 240 may store the LSB data in the plurality of program loops.

The second data latch 250 may store the CSB data in the plurality of first program loops.

In an embodiment, the first data latch 240 and the second data latch 250 may store the MSB data after the plurality of first program loops are performed.

In addition, the first data latch 240 and the second data latch 250 may store main verify data of a previous program loop.

FIG. 3 is a diagram illustrating a data bit corresponding to a state of a memory cell according to an embodiment of the present disclosure. The data bit described with reference to FIG. 3 may be described in an order of the MSB data, the CSB data, and the LSB data.

Referring to FIG. 3, a data bit corresponding to an erase state E may be '111'. A data bit corresponding to a first program state P1 may be '101'. A data bit corresponding to a second program state P2 may be '100'. A data bit corresponding to a third program state P3 may be '110'. A data bit corresponding to a fourth program state P4 may be '010'. A data bit corresponding to a fifth program state P5 may be '000'. A data bit corresponding to a sixth program state P6 may be '001'. A data bit corresponding to a seventh program state P7 may be '011'.

The data bit corresponding to each state may not be limited to the present embodiment. However, a data pattern of the MSB data may be the same as a pattern shown in FIG. 3, but data patterns of the CSB data and the LSB data may be set differently. That is, a data pattern of a first logical page data may have a preset data pattern, but a data pattern of the second logical page data may be set variously according to an embodiment.

In an embodiment, the first logical page data may have a first logic value 1 indicating an unselected memory cell with respect to at least one of program states P1 to P3 in which a threshold voltage distribution is sequentially increased from a program state in which the threshold voltage distribution is lowest among the plurality of program states P1 to P7. In an embodiment, the first logical page data may have a second logic value 0 which is inverted from the first logic value 1 with respect to remaining program states P4 to P7 in which the threshold voltage distribution is greater than that of the at least one of program states P1 to P3 among the plurality of program states P1 to P7.

Figure 4:
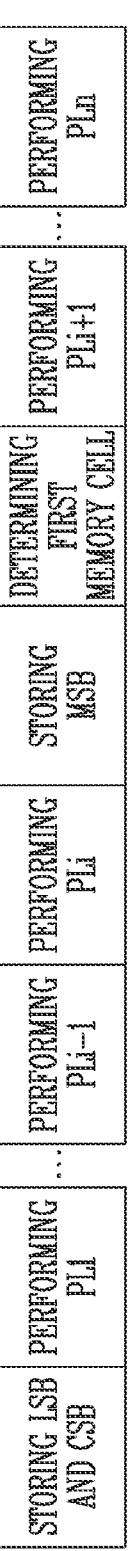
FIG. 4 is a diagram illustrating a program operation of a memory device according to an embodiment of the present disclosure.

FIG. 4 is a diagram illustrating a program operation of a memory device 100 according to an embodiment of the present disclosure.

Referring to FIGS. 2 and 4, the memory device 100 may store the LSB data and the CSB data in the first data latch 240 and the second data latch 250, respectively.

Thereafter, the memory device 100 may perform a plurality of first program loops PL1 to PLi based on the LSB data and the CSB data.

Thereafter, the memory device 100 may store the MSB data in the first data latch 240 and the second data latch 250.

Thereafter, the memory device 100 may determine first memory cells based on the MSB data. In an embodiment, the memory device 100 may control data stored in first page buffers corresponding to the first memory cells to set the first memory cells as program inhibit cells.

Thereafter, the memory device 100 may perform a plurality of second program loops PLi+1 to PLn based on the LSB data and the CSB data.

FIG. 5 is a diagram illustrating data stored in a data latch according to an embodiment of the present disclosure.

Referring to FIGS. 2 and 5, in the plurality of first program loops PL1 to PLi, the sensing latch 220 may store the bit line setting data and the sensing data. The pre-verify latch 230 may store the pre-verify data. The first data latch 240 may store the LSB data and the main verify data. The second data latch 250 may store the CSB data and the main verify data.

After performing the plurality of first program loops PL1 to PLi, the sensing latch 220 may store the bit line setting data and the sensing data. The pre-verify latch 230 may store the pre-verify data. The first data latch 240 may store the LSB data and the MSB data. The second data latch 250 may store the CSB data and the MSB data.

In the plurality of second program loops PLi+1 to PLn, the sensing latch 220 may store the bit line setting data and the sensing data. The pre-verify latch 230 may store the pre-verify data. The first data latch 240 may store the LSB data, the MSB data, and the main verify data. The second data latch 250 may store the CSB data, the MSB data, and the main verify data.

Figure 6:
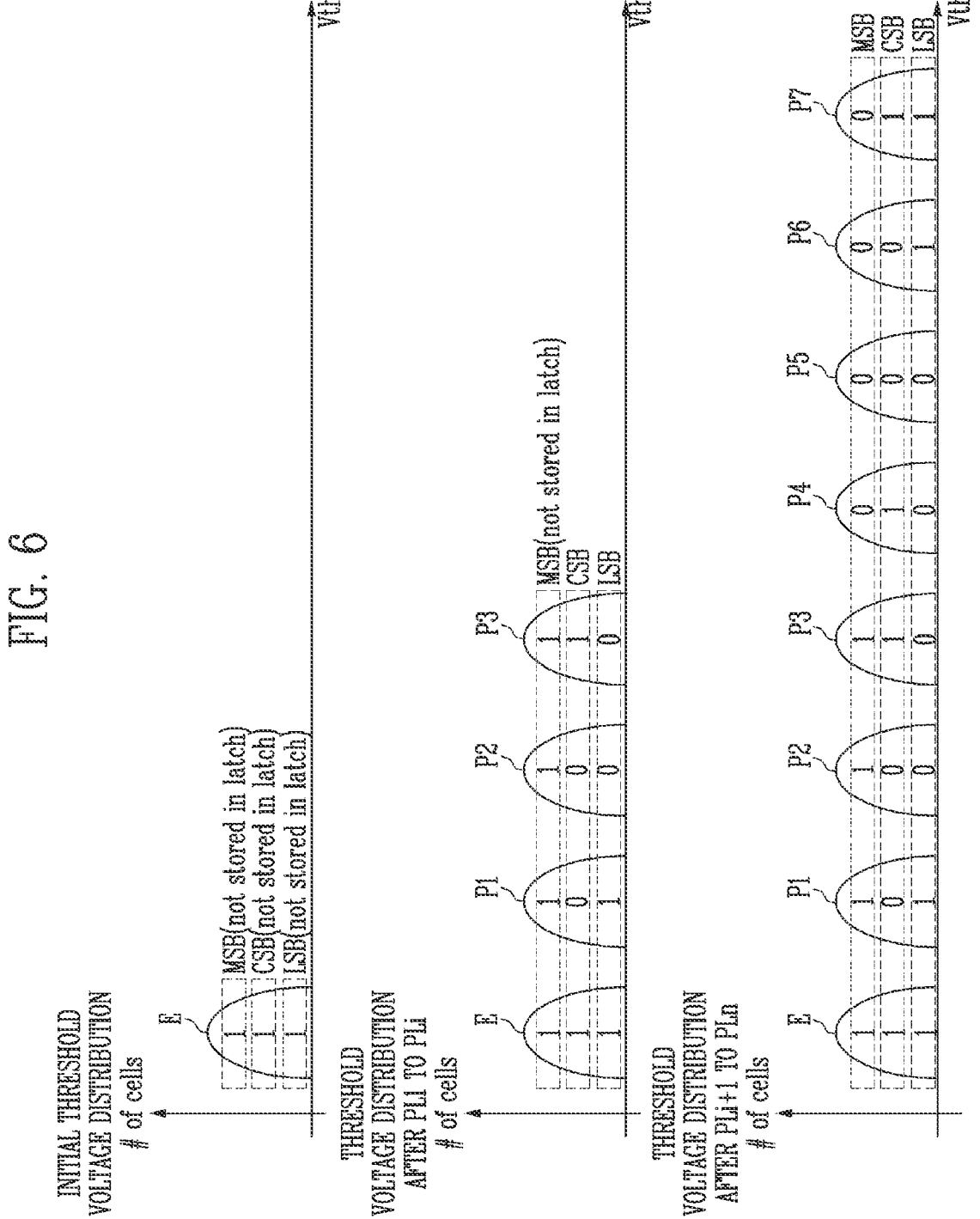
FIG. 6 is a diagram illustrating a threshold voltage distribution of a plurality of memory cells according to an embodiment of the present disclosure.

FIG. 6 is a diagram illustrating a threshold voltage distribution of a plurality of memory cells according to an embodiment of the present disclosure.

Referring to FIG. 6, an initial threshold voltage distribution of the plurality of memory cells may correspond to the erase state E. At this time, a latch corresponding to each memory cell may be in a state in which the MSB data, the CSB data, and the LSB data are not stored.

After performing the plurality of first program loops PL1 to PLi, each of the plurality of memory cells may have a threshold voltage corresponding to a program state among the erase state E and the first to third program states P1 to P3. At this time, the latch corresponding to each memory cell may be in a state in which the CSB data and the LSB data are stored and the MSB data is not stored. Specifically, in a case of the first to third program states P1 to P3, all MSB data may be the same as the first logic value 1. Therefore, the plurality of memory cells may be programmed to the first to third program states P1 to P3 only with the CSB data and the LSB data without the MSB data.

After performing the plurality of first program loops PL1 to PLi, each of the plurality of memory cells may have a threshold voltage corresponding to a program state among the erase state E and the first to seventh program states P1 to P7. At this time, the latch corresponding to each memory cell may be in a state in which the MSB data, the CSB data, and the LSB data are stored. Specifically, in a case of the fourth to seventh program states P4 to P7, all MSB data may be the same as the second logic value 0. Therefore, after the first memory cells are set as program inhibit cells based on the MSB data, the second memory cells may be programmed to the fourth to seventh program states P4 to P7 only with the CSB data and the LSB data without the MSB data.

FIG. 7 is a diagram illustrating an example of setting first memory cells as program inhibit cells according to an embodiment of the present disclosure.

Referring to FIG. 7, the program operation controller 131 of FIG. 1 may determine memory cells in which the first logical page data to be stored in each of the plurality of memory cells includes the first logic value 1 as the first memory cells. For example, the memory cells to be programmed to a program state among the first to third program states P1 to P3 may store the MSB data including the first logic value 1. In this case, the MSB including the first logic value 1 may be stored in the first data latch 240 and the second data latch 250 corresponding to the corresponding memory cells. Accordingly, the program operation controller 131 may determine the corresponding memory cells as the first memory cells.

In an embodiment, the program operation controller 131 may control the first page buffers corresponding to the first memory cells so that the first memory cells are set as the program inhibit cells.

For example, the first page buffers may store the first logic value 1 in at least one data latches in the plurality of second program loops. Specifically, the first page buffers may store the first logic value 1 in the first data latch 240 and the second data latch 250. Accordingly, the first data latch 240 and the second data latch 250 corresponding to the first memory cells may be in a state in which the CSB data and the LSB data corresponding to the erase state E are stored. That is, the first data latch 240 and the second data latch 250 corresponding to the first memory cells may be set as the same value as data latches of the memory cell having the erase state E. In this case, the first memory cells may be recognized as the program inhibit cells.

Thereafter, the program operation controller 131 may control the plurality of second program loops based on the at least one second logical page data, that is, the LSB data and the CSB data.

FIG. 8 is a flowchart illustrating a method of operating a memory device according to an embodiment of the present disclosure. The method shown in FIG. 8 may be performed by, for example, the memory device 100 shown in FIG. 1.

Referring to FIG. 8, at operation S801, the memory device 100 may store the at least one second logical page data except for the first logical page data among the plurality of logical page data in at least one data latches.

At operation S803, the memory device 100 may perform the program operation on the plurality of memory cells based on the at least one second logical page data. In an embodiment, the memory device 100 may perform the program operation so that the plurality of memory cells have a threshold voltage corresponding to at least one first program states in which the threshold voltage distribution is sequentially increased from the program state in which the threshold voltage distribution is the lowest.

At operation S805, the memory device 100 may store the first logical page data in the at least one data latches.

At operation S807, the memory device 100 may determine the first memory cells having the target threshold voltage distribution among the plurality of memory cells based on the first logical page data. The memory device 100 may determine, as the first memory cells, the memory cells in which the first logical page data including a logic value corresponding to the erase state to be stored.

At operation S809, the memory device 100 may perform the program operation on the second memory cells except for the first memory cells among the plurality of memory cells based on the at least one second logical page data. The memory device 100 may perform the program operation so that the second memory cells have a threshold voltage corresponding to a plurality of second program states of which a threshold voltage distribution is greater than that of the at least one first program states.

Figure 9:
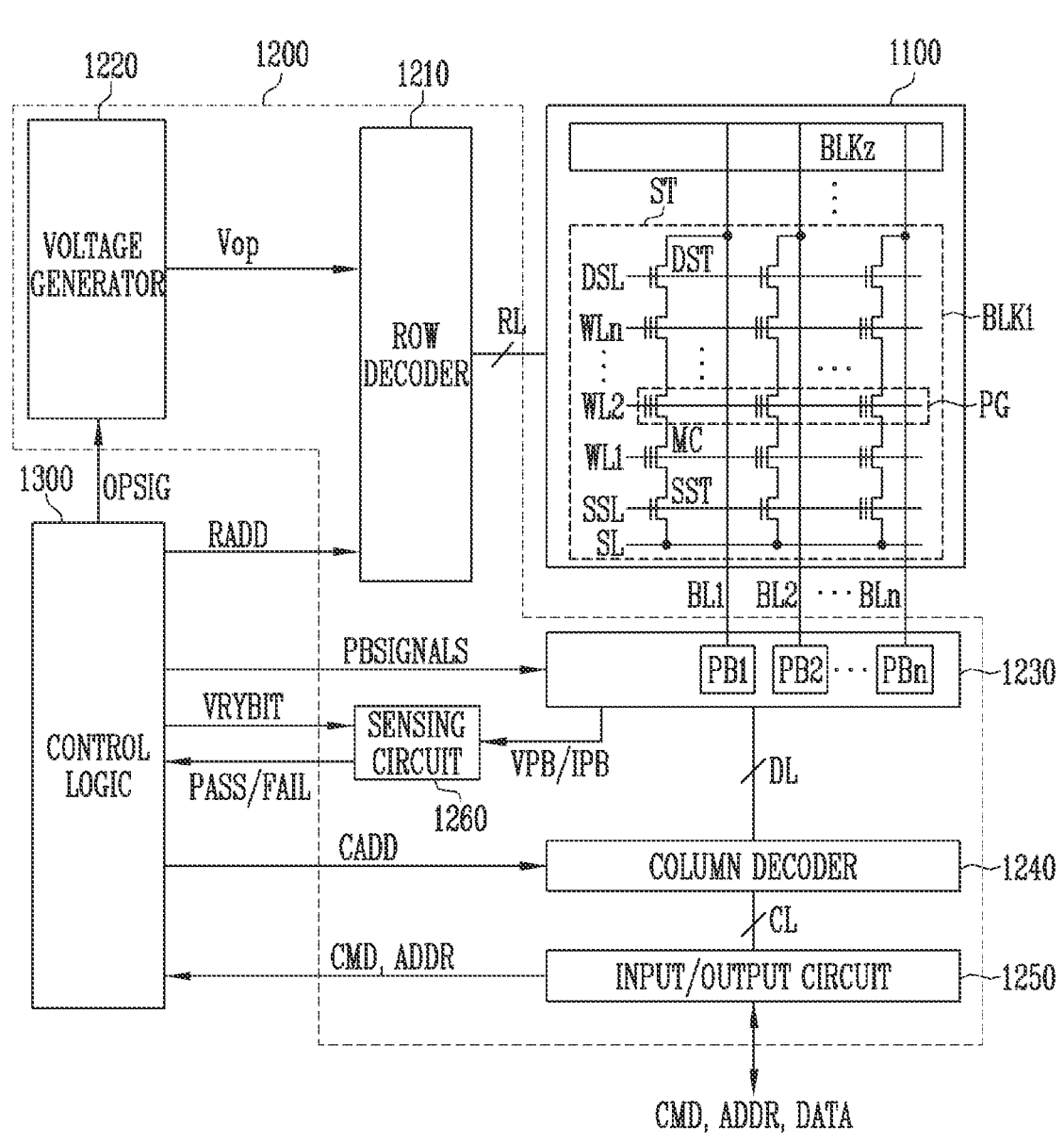
FIG. 9 is a diagram illustrating another example of a memory device according to an embodiment of the present disclosure.

FIG. 9 is a diagram illustrating another example of a memory device 1000 according to an embodiment of the present disclosure.

Referring to FIG. 9, the memory device 1000 may include a memory cell array 1100, a peripheral circuit 1200, and a control logic 1300. A configuration and an operation of the memory cell array 110, the page buffer groups 120, and the control logic 130 described with reference to FIG. 1 may be equally applied to the memory cell array 1100, page buffer groups 1230, and the control logic 1300.

The memory cell array 1100 may include a plurality of memory blocks BLK1 to BLKz.

The plurality of memory blocks BLK1 to BLKz may be connected to a row decoder 1210 through row lines RL. Here, the row lines RL may include at least one source select line SSL, a plurality of word lines WL1 to WLn, and at least one drain select line DSL. The plurality of memory blocks BLK1 to BLKz may be connected to the page buffer group 1230 through the bit lines BL1 to BLn.

The plurality of memory blocks BLK1 to BLKz may include a plurality of memory cell strings ST. The bit lines BL1 to BLn may be connected to each of the memory cell strings ST, and a source line SL may be commonly connected to the memory cell strings ST. The memory cell string ST may include at least one source select transistor SST, the plurality of memory cells MC, and at least one drain select transistor DST connected in series between the source line SL and the bit lines BL1 to BLn.

Each of the plurality of memory blocks BLK1 to BLKz may include the plurality of memory cells MC. Memory cells MC connected to the same word line may be defined as one page PG. In an embodiment, the page PG may be a unit for storing data in the memory device 1000 or reading data stored in the memory device 1000.

The peripheral circuit 1200 may be configured to perform the program operation, a read operation, or an erase operation on a selected area of the memory cell array 1100 under control of the control logic 1300.

The peripheral circuit 1200 may include the row decoder 1210, a voltage generator 1220, the page buffer group 1230, a column decoder 1240, an input/output circuit 1250, and a sensing circuit 1260.

The row decoder 1210 may be configured to decode a row address RADD received from the control logic 1300. The row decoder 1210 selects at least one memory block among the memory blocks BLK1 to BLKz according to a decoded address. In addition, the row decoder 1210 may select at least one word line of a selected memory block according to the decoded address. The row decoder 1210 may apply voltages Vop generated by the voltage generator 1220 to the selected word line.

During the program operation, the row decoder 1210 may apply the program voltage, the program pass voltage, the verify voltage, or the verify pass voltage to the word line.

The voltage generator 1220 may be configured to generate a plurality of voltages using an external power voltage supplied to the memory device 1000. Specifically, the voltage generator 1220 may generate various operation voltages Vop used for the program, read, and erase operations in response to an operation signal OPSIG. The plurality of generated voltages Vop may be supplied to the memory cell array 1100 through the row decoder 1210.

The page buffer group 1230 may store the at least one second logical page data in regular program loops in response to the page buffer control signals PBSIGNALS. In addition, the page buffer group 1230 may store the first logical page data after certain program loops are performed.

The column decoder 1240 may transfer data between the input/output circuit 1250 and the page buffer group 1230 in response to a column address CADD.

The input/output circuit 1250 may transfer the command CMD and the address ADDR received from the memory controller to the control logic 1300 or exchange data DATA with the column decoder 1240.

During the read operation or the verify operation, the sensing circuit 1260 may generate a reference current in response to an allowable bit VRYBIT, compare a sensing voltage VPB received from the page buffer group 1230 with a reference voltage generated by the reference current, and output a pass signal PASS or a fail signal FAIL. Alternatively, the sensing circuit 1260 may generate the reference voltage in response to the allowable bit VRYBIT, compare a sensing current IPB received from the page buffer group 1230 with a reference current generated by the reference voltage, and output the pass signal PASS or the fail signal FAIL.

The control logic 1300 may output the operation signal OPSIG, the row address RADD, the page buffer control signals PBSIGNALS, and the allowable bit VRYBIT in response to the command CMD and the address ADDR to control the peripheral circuits 1200.

In an embodiment, the control logic 1300 may determine the first memory cells having the target threshold voltage based on the first logical page data after certain program loops are performed. The control logic 1300 may control the page buffer group 1230 to set the first memory cells as the program inhibit cells.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal.

What is claimed is:

1. A memory device comprising:
a plurality of memory cells connected to a selected word line among a plurality of word lines, each programmed to one program state among a plurality of program states;
a plurality of page buffers configured to store at least one second logical page data in a plurality of first program loops performed on the plurality of memory cells, and store first logical page data after the plurality of first program loops are performed, the at least one second logical page data being logical page data except for the first logical page data among a plurality of logical page data to be stored in the plurality of memory cells; and
a control logic configured to:
control the plurality of first program loops based on the at least one second logical page data;
determine, based on logic values of the first logical page data, first memory cells having a target threshold voltage distribution among the plurality of memory cells;
control the first memory cells determined as having the target threshold voltage distribution based on the logic values of the first logical page data to be set as program inhibit cells; and
control a plurality of second program loops performed on second memory cells, the first memory cells being memory cells programmed to the one program state among the plurality of memory cells, the second memory cells being memory cells except for the first memory cells among the plurality of memory cells.

2. The memory device of claim 1, wherein each of the plurality of page buffers includes at least one data latch storing the plurality of logical page data to be stored in one memory cell among the plurality of memory cells.

3. The memory device of claim 2, wherein the control logic determines, as the first memory cells having the target threshold voltage distribution, the memory cells of the plurality of memory cells, in which the first logical page data, including a first logic value indicating an unselected memory cell, is to be stored.

4. The memory device of claim 3, wherein the control logic controls first page buffers corresponding to the first memory cells among the plurality of page buffers so that the first memory cells are set as program inhibit cells.

5. The memory device of claim 4, wherein the first page buffers store the first logic value in the at least one data latch in the plurality of second program loops.

6. The memory device of claim 2, wherein each of the plurality of page buffers comprises:

a sensing latch configured to store data sensed from a bit line connected to the one memory cell; and a pre-verify latch configured to store pre-verify data indicating whether to apply a pre-verify voltage, having a potential level less than a main verify voltage, to the selected word line.

7. The memory device of claim 1, wherein the first logical page data includes a first logic value and a second logic value, wherein the first logic value indicates an unselected memory cell with respect to at least one first program state in which a threshold voltage distribution is sequentially increased from a program state in which the threshold voltage distribution is lowest among the plurality of program states, and wherein the second logic value is inverted from the first logic value with respect to a plurality of remaining second program states in which the threshold voltage distribution is greater than that of the at least one first program state.

8. The memory device of claim 7, wherein the first memory cells are programmed to one program state among the at least one first program state.

9. The memory device of claim 1, wherein the control logic controls the plurality of second program loops based on the at least one second logical page data.

10. A method of operating a memory device, the method comprising:

storing, in at least one data latch, at least one second logical page data except for first logical page data among a plurality of logical page data;

performing a program operation on a plurality of memory cells based on the at least one second logical page data;

storing the first logical page data in the at least one data latch;

determining, based on logic values of the first logical page data, first memory cells having a target threshold voltage distribution among the plurality of memory cells;

controlling the first memory cells determined as having the target threshold voltage distribution based on the logic values of the first logical page data to be set as program inhibit cells; and performing a program operation on second memory cells except for the first memory cells among the plurality of memory cells based on the at least one second logical page data.

11. The method of claim 10, wherein the performing the program operation on the plurality of memory cells comprises performing the program operation so that the plurality of memory cells have a threshold voltage corresponding to at least one first program state in which a threshold voltage distribution is sequentially increased from a program state in which the threshold voltage distribution is lowest.

12. The method of claim 11, wherein the performing the program operation on the second memory cells comprises performing the program operation so that the second memory cells have a threshold voltage corresponding to a plurality of second program states in which the threshold voltage distribution is greater than that of the at least one first program state.

13. The method of claim 10, wherein the determining the first memory cells comprises determining, as the first memory cells having the target threshold voltage distribution, the memory cells of the plurality of memory cells, in which a logic value, corresponding to an erase state, is to be stored.

14. A memory device comprising:

a plurality of memory cells connected to a selected word line among a plurality of word lines, including a triple level cell (TLC) storing three bits of data;

a plurality of page buffers configured to store least significant bit (LSB) data and central significant bit (CSB) data in a plurality of first program loops, and store most significant bit (MSB) data after the plurality of first program loops are performed, the LSB data and the CSB data being data to be stored in the plurality of memory cells, the plurality of first program loops being performed on the plurality of memory cells; and a control logic configured to:

control the plurality of first program loops based on the LSB data and the CSB data;

determine, based on logic values of the MSB data, first memory cells having a target threshold voltage distribution among the plurality of memory cells;

control the first memory cells determined as having the target threshold voltage distribution based on the logic values of the MSB data to be set as program inhibit cells; and control a plurality of second program loops performed on second memory cells based on the LSB data and the CSB data, the first memory cells having a target threshold voltage among the plurality of memory cells, the second memory cells being memory cells except for the first memory cells among the plurality of memory cells.

\* \* \* \* \*